(12) United States Patent
Uchida et al.

(10) Patent No.: US 8,188,577 B2
(45) Date of Patent: May 29, 2012

(54) PRODUCTION METHOD OF SEMICONDUCTOR DEVICE, SEMICONDUCTOR DEVICE, AND EXPOSURE APPARATUS

(75) Inventors: Seiichi Uchida, Osaka (JP); Hiroyuki Ogawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 288 days.

(21) Appl. No.: 12/665,173

(22) PCT Filed: Jul. 14, 2008

(86) PCT No.: PCT/JP2008/062701
§ 371 (c)(1),
(2), (4) Date: Dec. 17, 2009

(87) PCT Pub. No.: WO2009/016951
PCT Pub. Date: Feb. 5, 2009

(65) Prior Publication Data
US 2010/0171199 A1    Jul. 8, 2010

(30) Foreign Application Priority Data
Aug. 1, 2007  (JP) ................................ 2007-200632

(51) Int. Cl.
*H01L 23/58* (2006.01)

(52) U.S. Cl. . 257/642; 257/759; 257/347; 257/E29.273; 257/E21.242; 438/780; 438/781; 438/760

(58) Field of Classification Search ................. 257/642, 257/759, 347, E29.273, E21.242; 438/780, 438/781, 760
See application file for complete search history.

(56) References Cited

U.S. PATENT DOCUMENTS

| | | | |
|---|---|---|---|
| 4,828,967 A * | 5/1989 | Mase et al. | 430/315 |
| 4,918,504 A | 4/1990 | Kato et al. | |
| 5,198,377 A | 3/1993 | Kato et al. | |
| 5,936,291 A * | 8/1999 | Makita et al. | 257/405 |
| 2002/0050489 A1 * | 5/2002 | Ikegami et al. | 219/121.69 |

FOREIGN PATENT DOCUMENTS

| | | |
|---|---|---|
| JP | 60-257171 A | 12/1985 |
| JP | 1-165127 A | 6/1989 |
| JP | 2-20828 A | 1/1990 |
| JP | 8-23102 A | 1/1996 |

OTHER PUBLICATIONS

Chinese Office Action for corresponding CN Appln. No. 200880101115.2, Patent Office of the People's Republic of China, Feb. 24, 2011.

* cited by examiner

*Primary Examiner* — Tu-Tu Ho
(74) *Attorney, Agent, or Firm* — Birch, Stewart, Kolasch & Birch, LLP (57) ABSTRACT

The present invention provides a production method of a semiconductor device, involving formation of a flattening layer and easy process for layers formed on a semiconductor layer, and also provides a semiconductor device preferably produced by such a production method.

The present invention further provides an exposure apparatus preferably used in such a production method. The present invention is a production method of a semiconductor device including a semiconductor layer and a flattening layer on a substrate, the flattening layer surrounding the semiconductor layer when the substrate is viewed in plane, the production method comprising the steps of:

forming the semiconductor layer on the substrate;

forming a photosensitive organic film on the semiconductor layer, the photosensitive organic film having a photosensitive wavelength range overlapping with an absorption wavelength range of the semiconductor layer, and forming a flattening layer by exposing the photosensitive organic film from a side of the substrate to light having a wavelength range corresponding to the photosensitive wavelength range of the photosensitive organic film, thereby developing the photosensitive organic film.

7 Claims, 6 Drawing Sheets

PRODUCTION METHOD OF SEMICONDUCTOR DEVICE, SEMICONDUCTOR DEVICE, AND EXPOSURE APPARATUS

TECHNICAL FIELD

The present invention relates to a production method of a semiconductor device, a semiconductor device, and an exposure apparatus. More particularly, the present invention relates to a production method of a semiconductor device including thin film transistors and wiring layers, used in an active matrix driving device, and also to a semiconductor device preferably produced by such a method. Further, the present invention relates to an exposure apparatus preferably used in such a production method.

BACKGROUND ART

Semiconductor devices are active element-including electronic devices using electrical characteristics of a semiconductor. Such semiconductor devices have been widely used in audio equipment, communication equipment, computers, electric appliances, and the like. The semiconductor devices are typically configured to include TFTs (thin film transistors) formed on a glass substrate, and wiring layers such as gate, source and drain wirings connected to the TFTs. The TFTs are used as a switching element or a driving circuit for controlling driving of pixels, in active matrix liquid crystal display devices, and the like. Larger and higher-definition LCDs are now being developed rapidly. Along with this, the semiconductor devices need to be more improved in performances, and more efficient production steps for such devices are also needed.

TFTs are typically so configured that a semiconductor layer, a gate insulating film, a gate electrode, and an interlayer insulating film are stacked on a glass substrate; source and drain electrodes are connected to the semiconductor layer through a contact hole formed in the interlayer insulating film, and a gate wiring is connected to the gate electrode. Further, a source wiring is connected to the source electrode, and a drain wiring is connected to the drain electrode.

In such a configuration in which base patterns, including the gate electrode, are formed, and thereon, the source electrode (wiring layer) and the like is formed, malfunction of the semiconductor device possibly occurs depending on a shape of the base patterns.

Figure 6:
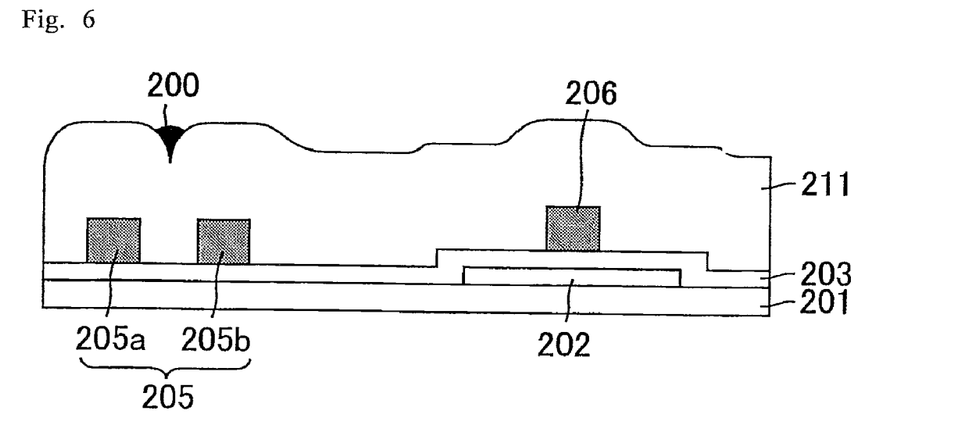
FIG. 6 is a cross-sectional view schematically showing a conventional semiconductor device including no flattening layer.

Specifically, according to such a configuration as in FIG. 6 in which a TFT including a semiconductor layer 202, a gate insulating film 203, and a gate electrode 206, stacked each other; a gate wiring 205a; a source wiring 205b; and an interlayer insulating film 221 covering these components are formed on a glass substrate 201, a metal residue 200 that might be generated at formation of a wiring layer 205 is deposited on the interlayer insulating film 211 in a region overlapping with the wiring layer 205 such as a gate wiring 205a, a source wiring 205b, and the like. This metal residue 200 might cause a short-circuit between the wiring layers 205.

For this problem, for example, Patent Documents 1 to 3 disclose the following method for flattening the base patterns. Base patterns such as a gate electrode are formed on a substrate, and then, a photosensitive organic film with insulating property is applied on the base patterns. This film is exposed from the substrate side using the base pattern as a mask, and then, a part of the film is removed by development. Thus, the base patterns are flattened.

This method for flattening the base patterns also has room for improvement from viewpoint of the above-mentioned improvement in efficiency of the production steps.
[Patent Document 1]
 Japanese Kokai Publication No. Hei-01-165127
[Patent Document 2]
 Japanese Kokai Publication No. Hei-02-20828
[Patent Document 3]
 Japanese Kokai Publication No. Hei-08-23102

DISCLOSURE OF INVENTION

For example, according to a semiconductor device including TFTs having a configuration like the above-mentioned one in which a semiconductor layer, a gate insulating film, a gate electrode, and an interlayer insulating film are stacked each other on a glass substrate, and source and drain electrodes are connected to the semiconductor layer through a contact hole formed in the interlayer insulating film, the following way of forming a flattening layer for flattening base patterns, shown in FIGS. 5-1 to 5-6, is mentioned. FIG. 5-1 to 5-6 are views showing a procedure of producing a semiconductor device in accordance with one example related to the present invention and each showing a cross-section of the device in respective steps.

First, a semiconductor layer 102 is formed on a glass substrate 101, and further, a gate insulating film 103 is formed on the substrate 101 and the semiconductor layer 102 as shown in FIG. 5-1. Then, a gate electrode 106 is formed in a region where a TFT is to be formed, and a gate wiring 105a and a source wiring 105b (wiring layer 105) are formed in the other region as shown in FIG. 5-2. Then, as shown in FIG. 5-3, a photosensitive organic film 109 is applied on the entire substrate region to have a thickness equivalent to that of the gate electrode 106, the gate wiring 105a, the source wiring 105b, and the like. Next, as shown in FIG. 5-4, the film 109 is cured by being exposed to light 110 having a wavelength corresponding to a photosensitive wavelength of the film 109 from the substrate 101 side, but the film 109 in a portion formed on the components made of light-shielding metal materials such as the gate electrode 106, the gate wiring 105a, and the source wiring 105b, is not cured because these components shield the light 110. The uncured portion of the film 109 is removed in a development step to give a flattening layer 119 shown in FIG. 5-5. Then, a flat interlayer insulating film 111 can be formed on the flattening layer 119, as shown in FIG. 5-6. The interlayer insulating film 111 and the flattening layer 119 are provided with contact holes, and a source wiring 113b and a drain wiring 113c each connected to the semiconductor layer 102 are formed in the contact holes, respectively.

Figure 55:
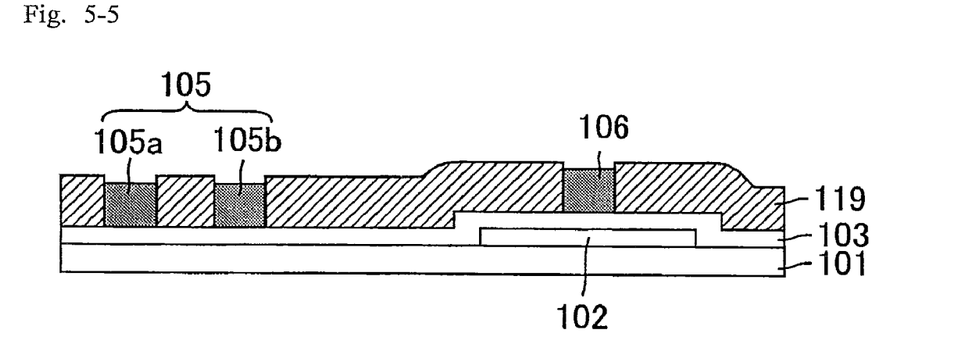
Figure 56:
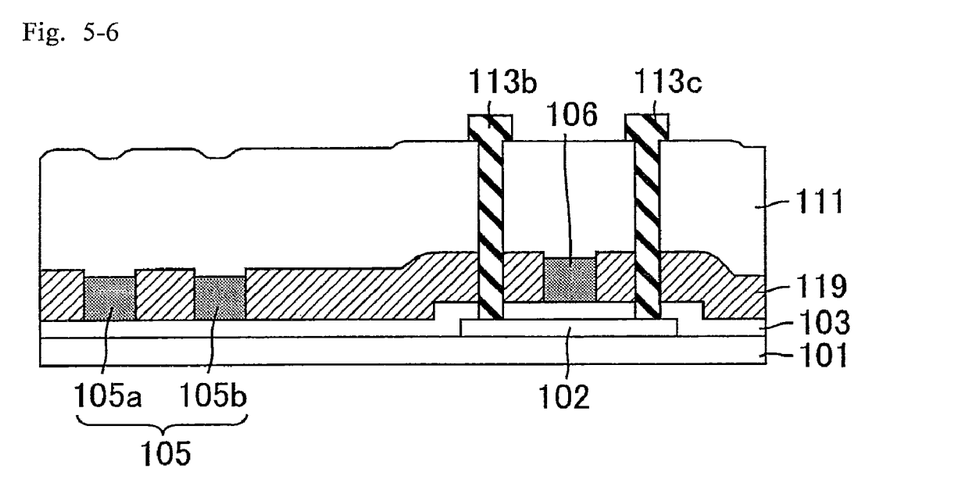

Thus, the flattening layer 119 can be formed, and the interlayer insulating film 111 formed thereon also can be flattened. As a result, the short-circuit between the wiring layers 105 can be hardly generated. However, this production method has the following problem, the inventors found. According to this production method, a photosensitive organic film material is used as a material for the flattening layer, and the flattening layer is pattern-formed by exposure and development using only the conductive films such as the gate electrode and the gate wiring as a mask. So the cured photosensitive organic film in the region where the conductive films are not used as a mask remains, for example, the cured photosensitive organic film on the semiconductor layer remains. Further, the inventors found that the cured photosensitive organic film need to be processed when an opening (contact hole) extending up to the semiconductor layer is formed, which needs an additional step.

The present invention has been made in view of the above-mentioned state of the art. The present invention has an object to provide a production method of a semiconductor device, involving formation of a flattening layer and easy process for layers formed on a semiconductor layer. Another object is to provide a semiconductor device preferably produced by such a production method. And another object is to provide an exposure apparatus preferably used in such a production method.

The present inventors made various investigations on a method for efficiently producing a semiconductor device including a flat interlayer insulating film. The inventors noted a flattening layer for flattening irregularities formed by the wirings layers and the like. Then, the inventors found the followings. If light having a wavelength range corresponding to an absorption wavelength range of the semiconductor layer is used for exposure, the semiconductor layer serves as a mask. Thereby, the photosensitive organic film on the semiconductor layer can be removed even if a photosensitive organic film is used to constitute the flattening layer. This method excludes an additional step for processing the cured film, e.g., a step of providing the cured film with a contact hole. As a result, the above-mentioned problems have been admirably solved, leading to completion of the present invention.

The present invention is a production method of a semiconductor device including a semiconductor layer and a flattening layer on a substrate,
the flattening layer surrounding the semiconductor layer when the substrate is viewed in plane,
the production method comprising the steps of:
forming the semiconductor layer on the substrate;
forming a photosensitive organic film on the semiconductor layer,
the photosensitive organic film having a photosensitive wavelength range overlapping with an absorption wavelength range of the semiconductor layer,
and
forming a flattening layer by exposing the photosensitive organic film from a side of the substrate to light having a wavelength range corresponding to the photosensitive wavelength range of the photosensitive organic film, thereby developing the photosensitive organic film. The present invention is mentioned below in detail.

The semiconductor device produced by the production method of the present invention includes a semiconductor layer and a flattening layer on a substrate. The flattening layer surrounds the semiconductor layer when the substrate is viewed in plane. The flattening layer flattens irregularities formed by components on the substrate. The flattening layer formed by the production method of the present invention is formed to surround the semiconductor layer and does not substantially overlap with the semiconductor layer. Irregularities formed by components formed on the semiconductor layer are typically not so large. In such a case, the flattening layer needs not to be formed. Examples of causes of the irregularities include wiring layers, such as gate, source, and drain wirings connected to a TFT, and a capacitor wiring. If a plurality of these wiring layers are formed spaced apart with a small distance therebetween for the purpose of increasing performances and definition of the device, an interlayer insulating film formed on the respective wiring layers and between the wiring layers might have a surface with large irregularities. Such irregularities make it difficult to properly pattern a wiring layer formed on the interlayer insulating film. This causes various problems, such as short-circuits between two wirings arranged with the interlayer insulating film therebetween or between wirings arranged on the interlayer insulating film. The flattening layer formed by the present invention is formed to suppress generation of these problems.

The semiconductor device produced by the production method of the present invention may or may not include other components as long as such components are essentially included. For example, the semiconductor device may include a gate insulating film, a gate electrode, and the like, formed on the semiconductor layer. The semiconductor layer may not be directly formed on the substrate, and an insulating film and the like may be formed between the two. Further, the flattening layer may not be directly formed on the substrate, and an insulating film and the like may be formed between the two.

The production method of the present invention includes the steps of:
(1) forming the semiconductor layer on the substrate;
(2) forming a photosensitive organic film on the semiconductor layer,
the photosensitive organic film having a photosensitive wavelength range overlapping with an absorption wavelength range of the semiconductor layer,
and
(3) forming a flattening layer by exposing the photosensitive organic film from a side of the substrate to light having a wavelength range corresponding to the photosensitive wavelength range of the photosensitive organic film, thereby developing the photosensitive organic film. The photosensitive organic film of the present invention has photo-curability and is cured by light having a wavelength corresponding to the photosensitive wavelength region of the film. The photosensitive organic film is often formed between the wiring layers, and so preferably has an insulating property.

The above-mentioned step (1) can be performed by a typical method of forming a semiconductor layer. Examples of a material for the semiconductor layer include silicon, germanium, and selenium. Amorphous silicon or polysilicon may be used as the silicon. The semiconductor layer may be formed by CVD (chemical vapor deposition), plasma CVD, low-pressure CVD, normal-pressure CVD, remote CVD, and the like.

In the above-mentioned steps (2) and (3), a photosensitive organic film having a photosensitive wavelength range overlapping with an absorption wavelength range of the semiconductor layer is formed on the semiconductor layer. The photosensitive organic film in this step is preferably formed in the entire substrate region, not only on the semiconductor layer, in view of production steps. If components such as a wiring layer and an electrode are arranged on the substrate, the photosensitive organic film may be formed on these components. Then, light having a wavelength range corresponding to the photosensitive wavelength range of the photosensitive organic film is radiated to the entire substrate from the substrate side to cure the film. The photosensitive wavelength range of the light corresponds also to the absorption wavelength range of the semiconductor layer, and so the semiconductor layer also serves as a mask, and the photosensitive organic film on the semiconductor layer is not exposed to the light. As a result, the photosensitive organic film on the semiconductor layer is not cured. Simultaneously, the photosensitive organic film formed in a region other than the region on the semiconductor layer and the conductive film is exposed to the light to be cured. The photosensitive organic film may not be directly in contact with the semiconductor layer. An insulating film and the like may be formed between the two. According to the production method of the present invention, a degree of overlapping between the absorption wavelength range of the semiconductor layer and the photosensitive wavelength range of the photosensitive organic film is not especially limited as long as the semiconductor layer absorbs light to such an extent that curing of the photosensitive organic film is inhibited. As a way of overlapping between these wavelength ranges, the following ways may be used. Light having a wavelength range corresponding to the photosensitive wavelength range of the photosensitive organic film may be used. Alternatively, without adjusting light to be radiated, the photosensitive film is made of two or more materials so that its photosensitive wavelength range correspond to both of the wavelength range of light radiated and the absorption wavelength range of the semiconductor layer.

In the subsequent development step, the photosensitive organic film on the semiconductor layer and the conductive film is removed, and as a result, the cured film remains in the other regions. Thus a flattening layer for flattening irregularities formed on the substrate is completed. According to the present invention, the flattening layer for flattening the surface with irregularities attributed to the wiring layers and the like can be formed, and the photosensitive organic film on the semiconductor layer can be removed. So there is no need to provide the cured photosensitive organic film on the semiconductor layer with any-process later, which leads to an improvement in production efficiency.

It is preferable that the production method further includes the steps of: forming an interlayer insulating film on the semiconductor layer; and providing the interlayer insulating film in a region overlapping with the semiconductor layer with an opening. The "interlayer insulating film" used herein means a layer for separating the semiconductor layer and other layers formed on the semiconductor layer, and it may be a single layer or a multi-layer as long as it has insulating property. The interlayer insulating film may be formed in the other regions as long as it is formed in the region overlapping with the semiconductor layer. For example, the interlayer insulating film may be formed on the wiring layer such as the gate wiring. According to such a method, even if the interlayer insulating film is formed on the semiconductor layer, an opening (for example, a contact hole) extending up to the semiconductor layer can be formed without any process for the photosensitive organic film, which leads to an improvement in production efficiency. Etching may be mentioned as a way of forming the opening. If the photosensitive organic film that has been cured is provided with contact holes, treatments for removing this film, such as ashing and stripping, need to be performed in addition to the step of providing the interlayer insulating film with contact holes. This complicates the production steps so much.

It is preferable that the production method further includes a step of forming an interlayer insulating film on the flattening layer, wherein the photosensitive organic film is made of a material with a relative permittivity lower than that of a material for the interlayer insulating film. The flattening layer in the production method of the present invention is typically arranged between the wiring layers because it is formed with the aim of flattening irregularities attributed to the wirings and the like formed on the substrate. It is preferable that the flattening layer is made of a material with as a low relative permittivity as possible. Particularly if the interlayer insulating film is formed on the flattening layer, the flattening layer is made of a material with a relative permittivity lower than that of the material for the interlayer insulating film, which allows a reduction in capacitance formed between the wiring layers. As a result, a semiconductor device in which delay of a signal transmitted to the wiring layer is suppressed can be provided.

The present invention is also a semiconductor device including a semiconductor layer on a substrate, wherein the semiconductor device includes a flattening layer surrounding the semiconductor layer when the substrate is viewed in plane, and the flattening layer is formed from a photosensitive organic film having a photosensitive wavelength range overlapping with an absorption wavelength range of the semiconductor layer. The semiconductor device of the present invention is a semiconductor device preferably produced by the above-mentioned production method of the present invention. The flattening layer of the semiconductor device of the present invention is formed to surround the semiconductor layer and does not substantially overlap with the semiconductor layer. In the present invention, a degree of overlapping between the absorption wavelength range of the semiconductor layer and the photosensitive wavelength range of the photosensitive organic film is not especially limited as long as the semiconductor layer absorbs light to such an extent that curing of the photosensitive organic film is inhibited.

According to the semiconductor device of the present invention, the flattening layer suppresses a structure that is to be formed thereon from having irregularities. As a result, various problems, such as short-circuits between two wirings arranged with the interlayer insulating film therebetween and between wirings arranged on the interlayer insulating film, can be suppressed. The flattening layer does not substantially overlap with the semiconductor layer. As a result, a production method of this semiconductor device does not need to include any process for the cured photosensitive organic film on the semiconductor layer.

It is preferable that the semiconductor device includes an interlayer insulating film on the semiconductor layer, and the interlayer insulating film in a region overlapping with the semiconductor layer has an opening. A step of providing the interlayer insulating film with an opening (contact hole) that connects the semiconductor layer to the wiring layer is typically performed. According to the present embodiment, however, there is no need to provide the cured photosensitive organic film on the semiconductor layer with an opening (contact hole), which is typically performed separately from the step of providing the interlayer insulating film with an opening (contact hole).

It is preferable that the semiconductor device includes an interlayer insulating film on the flattening film, and the photosensitive organic film is made of a material with a relative permittivity lower than that of a material for the interlayer insulating film. According to the semiconductor device, the flattening layer in the semiconductor device of the present invention is typically arranged between the wiring layers because it is formed with the aim of flattening irregularities attributed to the wirings and the like formed on the substrate. It is preferable that the flattening layer is made of a material with as a low permittivity as possible. Particularly if the interlayer insulating film is formed on the flattening layer, the flattening layer is made of a material with a relative permittivity lower than that of the material for the interlayer insulating film, which allows a reduction in capacitance formed between the wiring layers. As a result, a semiconductor device in which delay of a signal transmitted to the wiring layer is suppressed can be provided.

The present invention is an exposure apparatus used for producing a semiconductor device,
    the semiconductor device including a semiconductor layer and a flattening layer on a substrate,
    the flattening layer being formed by patterning a photosensitive organic film into a shape surrounding the semiconductor layer when the substrate is viewed in plane, wherein the exposure apparatus includes a light source that radiates light having a wavelength range overlapping with an absorption wavelength range of the semiconductor layer and with a photosensitive wavelength range of the flattening layer to the photosensitive organic film from a side of the substrate. An apparatus including a light source, a lens, a stage, and the like, is mentioned as such an exposure apparatus. The exposure apparatus of the present invention is preferably used in the above-mentioned production method of the present invention. With respect to light radiated by the exposure apparatus of the present invention, a degree of overlapping between the absorption wavelength range of the semiconductor layer and the photosensitive wavelength range of the photosensitive organic film is not especially limited as long as the semiconductor layer absorb light to such an extent that curing of the photosensitive organic film is inhibited. For example, silicon, which is preferably used as a material for the semiconductor layer, has an absorption wavelength range of 308 nm or lower. So it is preferable that the exposure apparatus can radiate light having a wavelength range of 308 nm or lower. The production apparatus of the present invention includes a light source that radiates light having a wavelength range overlapping with an absorption wavelength range of the semiconductor layer and with a photosensitive wavelength range of the flattening layer to the photosensitive organic film from a side of the substrate. So use of the production apparatus of the present invention permits efficient production of a semiconductor device including a flattening layer for flattening irregularities attributed to wiring layers and the like.

EFFECT OF THE INVENTION

According to the production method of the semiconductor device of the present invention, even if the flattening layer for flattening irregularities attributed to the wiring layers is formed from a photosensitive organic film, the photosensitive organic film after cured does not remain on the semiconductor layer and further, a process for forming a contact hole that connects the semiconductor layer to a wiring, and the like, is easily performed. This results in improvement in production efficiency.

BEST MODES FOR CARRYING OUT THE INVENTION

The present invention is mentioned in more detail below with reference to Embodiments using drawings, but not limited to only these Embodiments.

Embodiment 1

FIG. 1-1 to 1-10 are views showing a procedure of producing a semiconductor device in accordance with a production method of Embodiment 1 and each showing a cross-section of the device in respective steps.

A semiconductor layer is formed on a transparent substrate, first. The following method is mentioned as a method for forming the semiconductor layer, for example. An amorphous silicon layer is formed over the entire substrate by CVD and then thermally melted to be crystallized by excimer laser irradiation. Thus, a polysilicon layer is formed.

Figure 11:
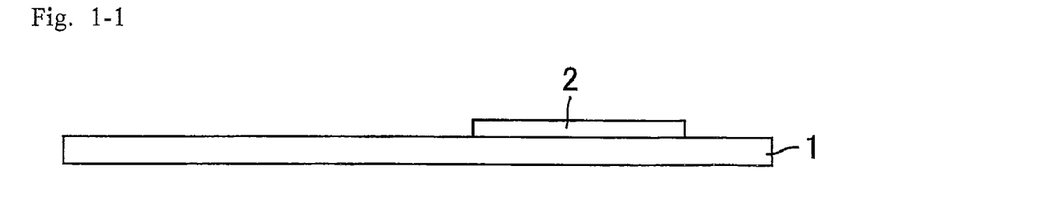

A resist is applied on the polysilicon layer and subjected to a selective exposure step involving use of a photomask. Successively, a development step is performed, and thereby the resist is patterned so that it remains on the polysilicon layer at specific positions. Then, using this resist pattern as a mask, the polysilicon layer is etched by dry etching, and as a result, a semiconductor layer 2 is formed into an island shape on the transparent substrate 1, as shown in FIG. 1-1. The resist pattern on the semiconductor layer 2 is removed. Glass, quartz, plastic, and the like, may be used as a material for the transparent substrate 1. The semiconductor layer 2 has a thickness of about 50 nm, for example.

Figure 12:
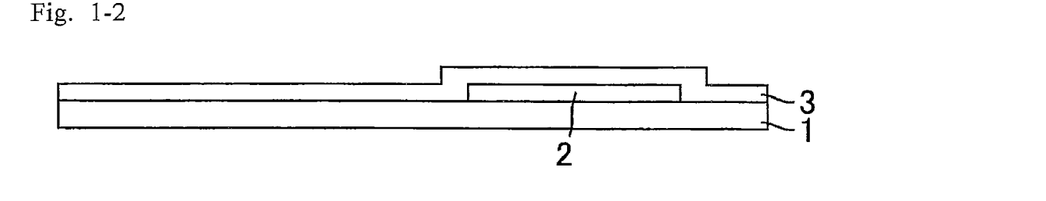

As shown in FIG. 1-2, an oxide film (TEOS film) with a thickness of 20 to 100 nm is formed on the transparent substrate 1 and the semiconductor layer 2 by plasma CVD and the like using TEOS (tetraethyl ortho silicate) and the like as a material. Thus a gate insulating film 3 is formed.

Figure 13:
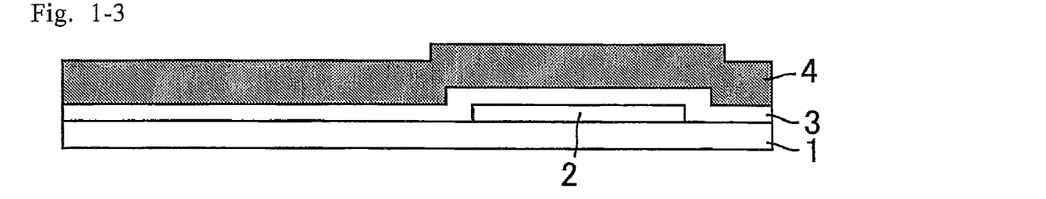

As shown in FIG. 1-3, a conductive film 4 is deposited on the gate insulating film 3 by sputtering and the like. The conductive film 4 is not especially limited as long as it absorbs or reflects light that is to be radiated later from a back face of the substrate. The conductive film 4 may be a singular film or a multi-layer film. The conductive film 4 may have a multi-layer structure composed of a lower layer of TaN (tantalum nitride) and an upper layer of W (tungsten). For example, the TaN film has a thickness of about 50 nm, and the W film has a thickness of about 370 nm.

Figure 14:
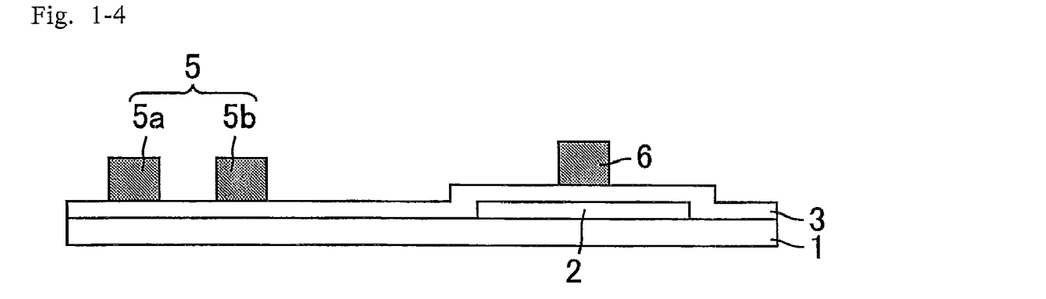

Then, a resist is applied on the conductive film 4 and subjected to a selective exposure step involving use of a photomask. Successively, a development step is performed, and thereby the resist is patterned so that it remains on the conductive film 4 at specific positions. Then, using this resist pattern as a mask, the conductive film 4 is etched by dry etching, and as a result, wiring layers 5 such as a gate wiring 5a and a source wiring 5b, and a gate electrode 6, are formed as shown in FIG. 1-4. Then, the resist pattern on the wiring layer 5 and the gate electrode 6 is removed.

Figure 15:
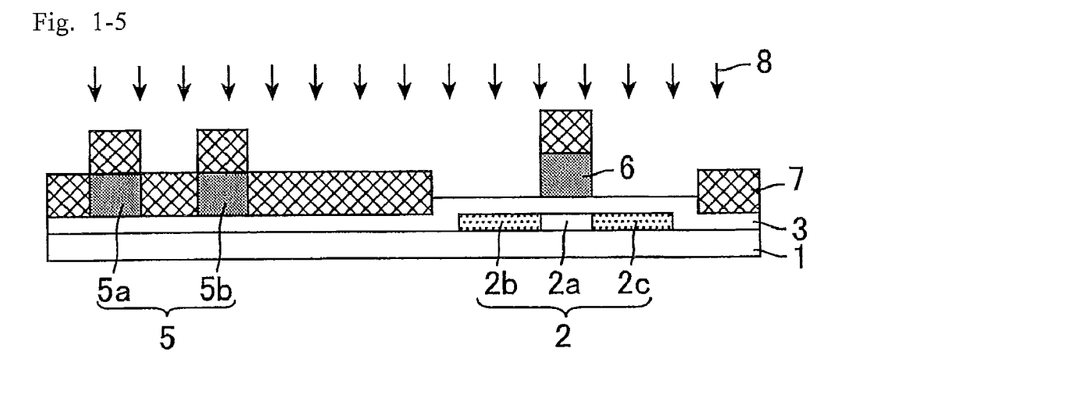

As shown in FIG. 1-5, a resist pattern 7 is formed on the transparent substrate 1 and the components in a region other than an ion-doped region where source and drain regions of the semiconductor layer 2 are to be formed. Successively, the resist pattern 7 and the gate electrode 6 are used as a mask, the semiconductor layer 2 is doped with phosphorus ions 8 at an accelerating voltage of 20 to 80 KeV and at a dose of $5 \times 10^{-14}$ to $1 \times 10^{-16}$ cm$^2$. As a result of this, the semiconductor layer 2 has a channel region 2a in a region overlapping with the gate electrode 6, and a source region 2b and a drain region 2c which have been doped with N-type impurities at a high concentration in the other region. If a P-type semiconductor is formed, the semiconductor layer is doped with boron ions under the same conditions. The semiconductor layer 2 is thermally annealed at 450 to 550° C., thereby activating the implanted ions.

Figure 16:
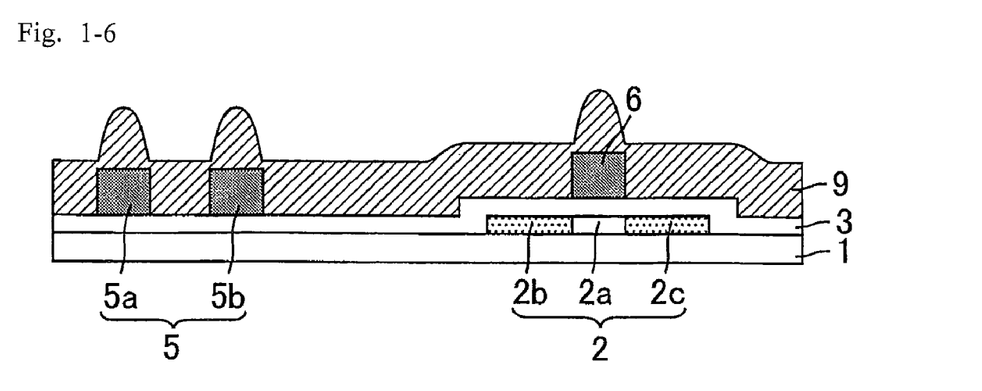

As shown in FIG. 1-6, a photosensitive organic film 9 with photocurability is applied on the transparent substrate 1 and the members to have a thickness identical to or larger than by about 50 nm that of the wiring layer 5 and the gate electrode 6. A negative resist and the like is mentioned as a material for the photosensitive organic film 9. According to the present Embodiment, a material having a photosensitive wavelength range overlapping with an absorption wavelength range of the silicon (the semiconductor layer) is used for the film 9. Silicon has an absorption wavelength range of 308 nm or lower, and so it is preferable that a material having a photosensitive wavelength range of 308 nm or lower is used for the film 9.

It is preferable that the photosensitive organic film 9 is made of a material with a relative permittivity lower than that of the below-mentioned material for an interlayer insulating film in order to reduce generation of a capacitance between adjacent wiring layers 5. Silicon nitride (SiN$_x$) and silicon oxide ($SiO_2$) are suitably used as a material for the interlayer insulating film, for example. Use of a material with a permittivity lower than that of these materials, e.g., use of photosensitive polyimide allows suppression of delay of a signal transmitted into the wiring layer 5. The photosensitive polyimide has a relative permittivity of 2.5 to 3.5, which is smaller than 6 to 7 of $SiN_x$ and 3.9 of $SiO_2$. As the above-mentioned photosensitive polyimide, a photosensitive polyimide coating agent (trade name: Negative Photoneece, Toray Industries, Inc.) may be used.

Figure 4:
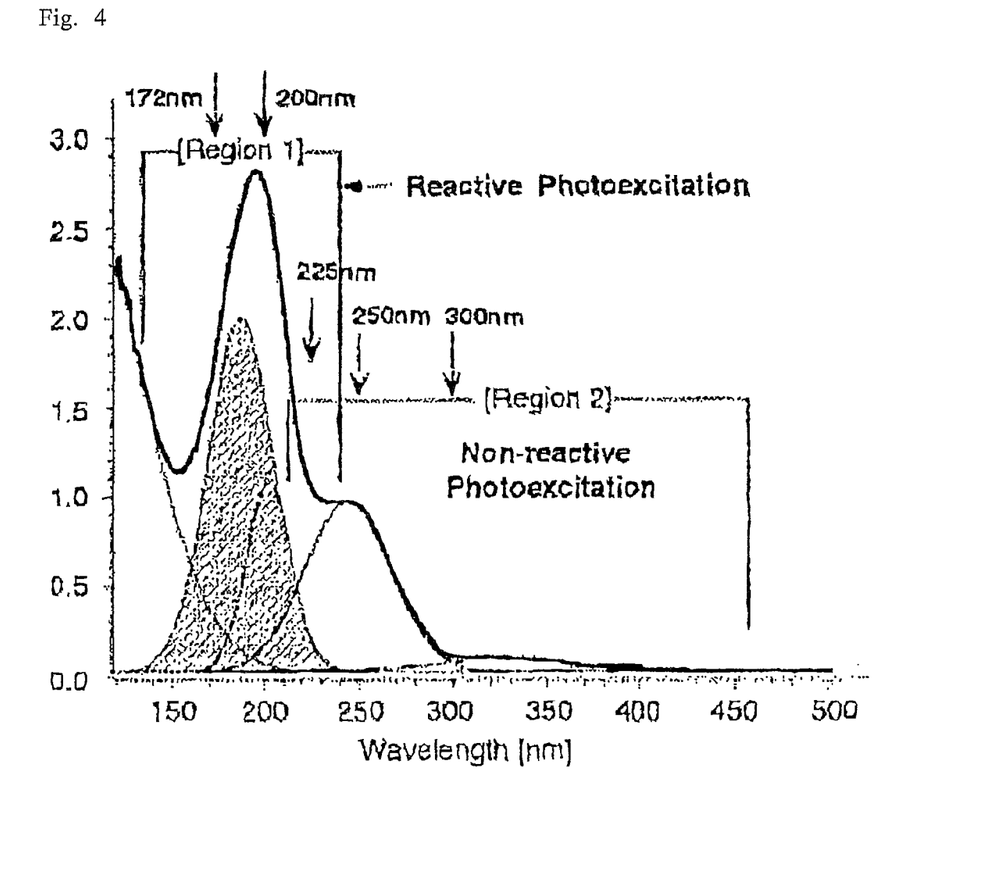
FIG. 4 is a graph showing an absorption spectrum of polyimide (CBDA/BAPP), which can be used as a material for the photosensitive organic film 9 in Embodiment 1.

FIG. 4 is a graph showing an absorption spectrum of polyimide (CBDA/BAPP), which can be used as a material for the photosensitive organic film 9 in Embodiment 1 (excerpted from Jpn. J. Appl. Phys. Vol 38 (1999) Suppl. 38-1 pp. 176-179). The thick solid line in FIG. 5 shows an absorption spectrum of polyimide (CBDA/BAPP). The absorption spectrum of polyimide (CBDA/BAPP) shows that light absorption is high at a wavelength range of 380 nm or lower where silicon absorbs light. Thus, the polyimide (CBDA/BAPP) is preferably used as a material for the photosensitive organic film 9 because the flattening layer for flattening irregularities between the wiring layers 5 and residue of the film 9 on the semiconductor layer 2 can be prevented.

Figure 17:
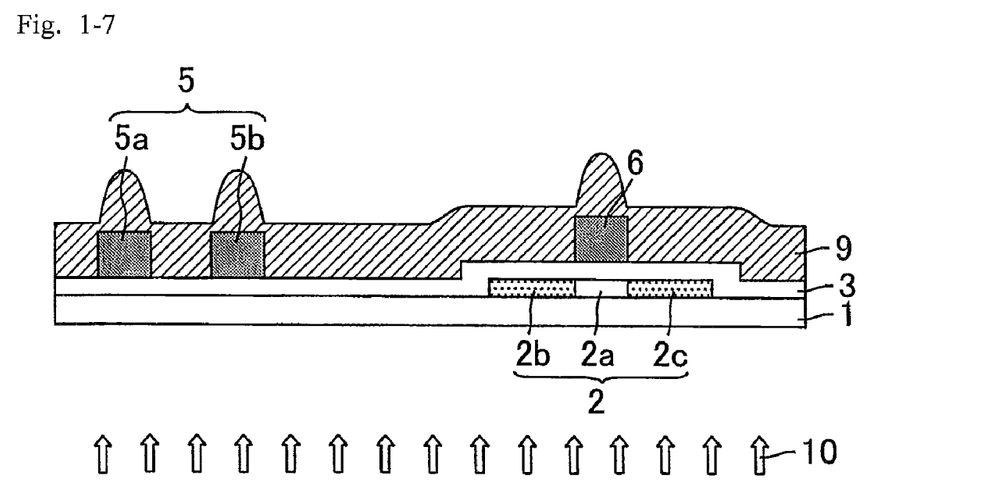

As shown in FIG. 1-7, light 10 is radiated to the entire transparent substrate 1 surface from a back surface side (on a side opposite to the semiconductor layer-formed side) of the transparent substrate 1, thereby curing the photosensitive organic film 9. The light 10 has a wavelength range corresponding to an absorption wavelength range of the source and drain regions 2b and 2c of the semiconductor layer 2 and also corresponding to a photosensitive wavelength range of the photosensitive organic film 9. According to the present Embodiment, the silicon having an absorption wavelength range of 308 nm or lower and the photosensitive organic film having a photosensitive wavelength range of 308 nm or lower are used. Therefore, it is preferable that light having a wavelength of 308 nm or lower is radiated. It is preferable that an exposure apparatus having a mechanism of radiating such light is used for the radiation.

A mercury-vapor lamp, a halogen lamp, a xenon lamp, a metal halide lamp, etc. are mentioned as the light source. If these light sources are used, it is preferable that an interference filter that can transmits light having a wavelength of 308 nm or lower. A light source for radiating light with a short wavelength range such as KrF excimer laser (248 nm) also may be used. Examples of the exposure apparatus include a stepping projection aligner (stepper), a proximity exposure apparatus, and a mirror projection exposure apparatus. The exposure apparatus commonly used for exposure from back side typically includes, as a light source, a mercury-vapor lamp that radiates light having g-line ($\lambda g=436$ nm), h-line ($\lambda h=405$ nm), and i-line ($\lambda i=365$ nm). This light having such wavelengths pass through silicon.

Figure 18:
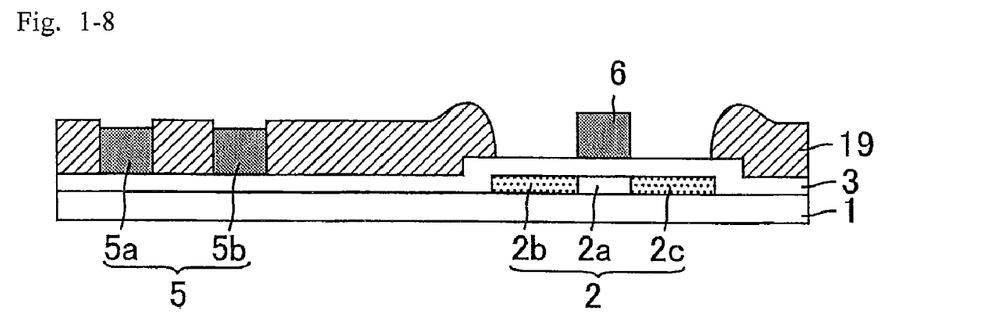

According to the present Embodiment, even if the light 10 is radiated to the entire transparent substrate 1 surface, the wiring layer 5 and the gate electrode 6, and further the semiconductor layer 2 serve as a mask, and thus, the photosensitive organic film 9 except for that formed on the wiring layer 5, the gate electrode 6, and the semiconductor layer 2 is cured. Then, by a development step, the uncured portion of the film 9, which is formed on the wiring layer 5, the gate electrode 6, and the semiconductor layer 2, is removed. As a result, the cured photosensitive organic film remains, as shown in FIG. 1-8. As a result, this film serves as the flattening layer 19 capable of flattening irregularities formed by the wiring layer 5 and the gate insulating film 3.

Figure 19:
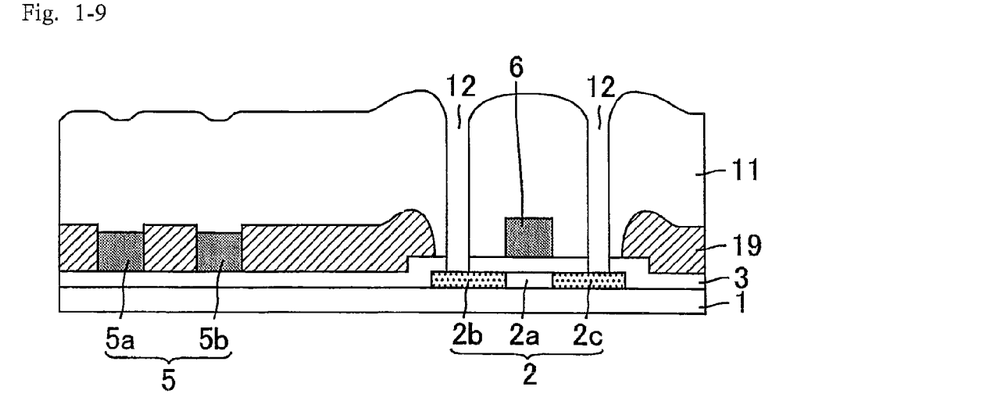
Figure 51:
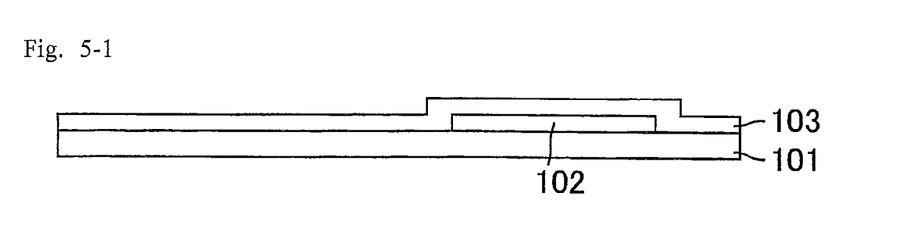
Figure 52:
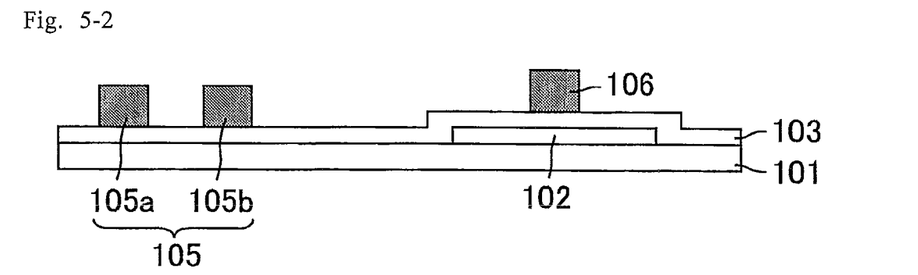
Figure 53:
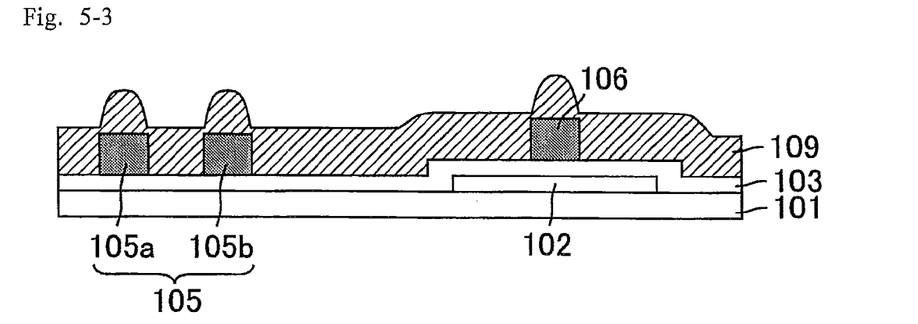
Figure 54:
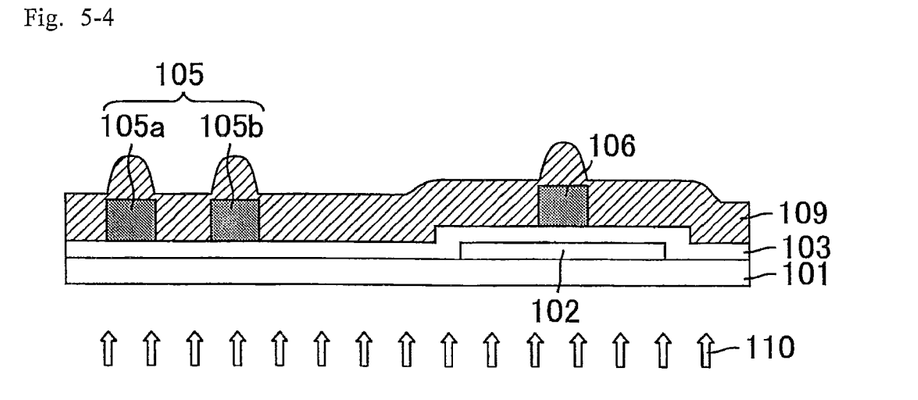

As shown in FIG. 1-9, an interlayer insulating film 11 is formed on the wiring layer 5, the gate electrode 6, the flattening layer 19, and the semiconductor layer 2. The interlayer insulating film 11 is formed from a silicon nitride film, a silicon oxide film, and the like with a thickness of 50 to 500 nm by CVD and the like.

Next, a resist pattern is formed on the interlayer insulating film 11 in a region other than the region where a contact hole is to be formed. Then, using this resist pattern as a mask, the interlayer insulating film 11 is partly etched by dry etching, and as a result, contact holes 12 extending through the interlayer insulating film 11 and the gate insulating film 13 to the semiconductor layer 2 are formed. Then, the resist pattern on the film 11 is removed. According to a conventional way, a flattening layer that is a cured photosensitive organic film exists between this film 11 and the gate insulating film 3, which makes it difficult to form such contact holes. According to the present Embodiment, an etching step can be performed without any modifications under typical conditions. Treatments for removing the photosensitive organic film such as ashing and stripping do not need to be additionally performed.

Figure 110:
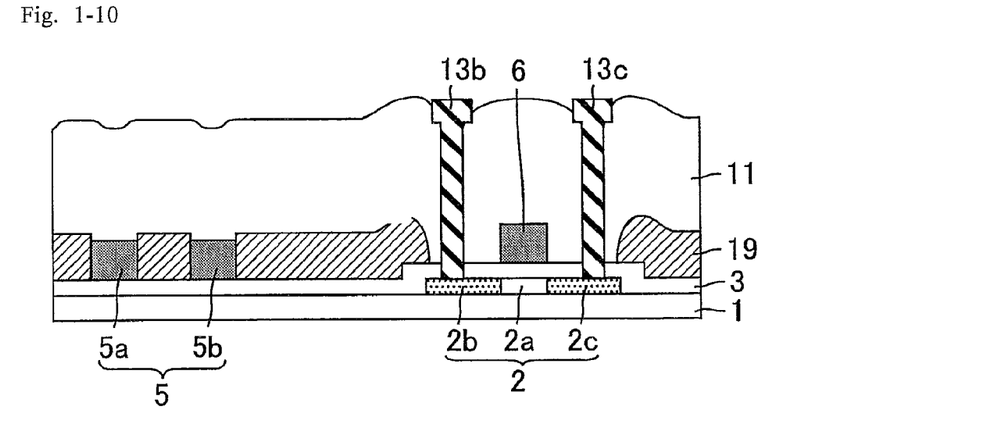

Finally, as shown in FIG. 1-10, a source wiring 13b and a drain wiring 13c, which are connected to the source region 2b and the drain region 2c of the semiconductor layer 2, respectively, are formed in the contact holes 12 by sputtering and the like. A material for the source and drain wirings 13b and 13c may be titanium (Ti), an Al—Ti multilayer structure, and the like.

Figure 2:
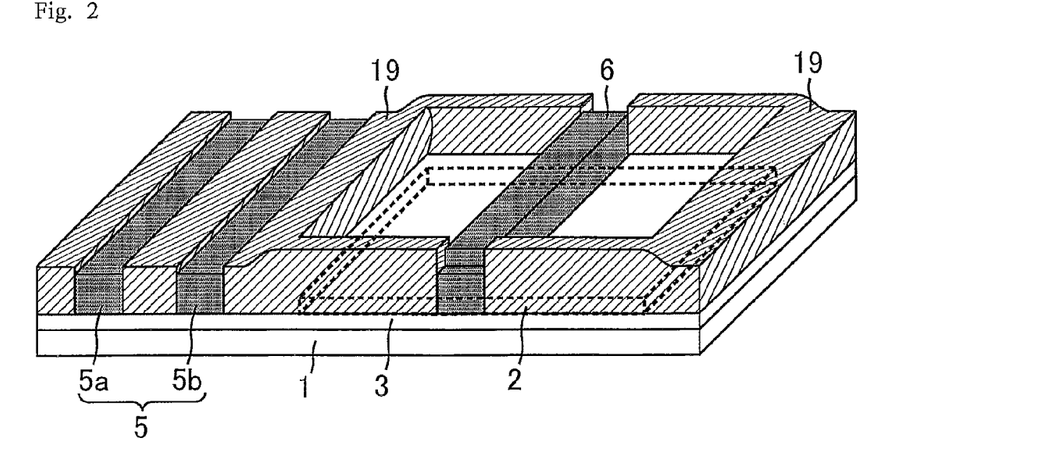
FIG. 2 is a perspective view schematically showing the semiconductor device produced by the production method of Embodiment 1.
Figure 3:
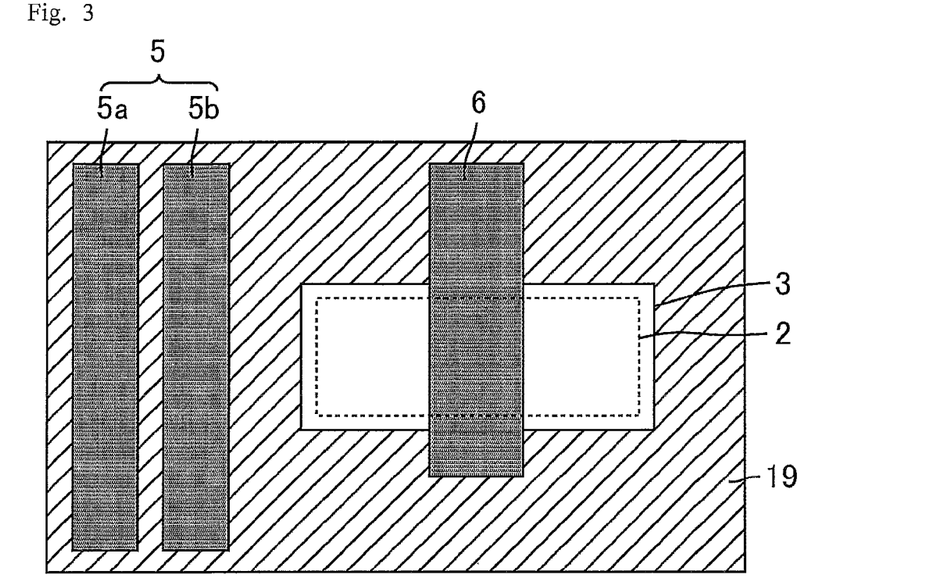
FIG. 3 is a plan view schematically showing the semiconductor device produced by the production method of Embodiment 1.

FIG. 2 is a perspective view schematically showing a semiconductor device produced by the production method of Embodiment 1. FIG. 3 is a plan view schematically showing a semiconductor device produced by the production method of Embodiment 1. As shown in FIG. 2, the semiconductor device produced by the production method of Embodiment 1 includes a semiconductor layer 2 and a gate insulating film 3 on a substrate 1, and further includes a gate electrode 6 formed on a semiconductor layer 2 with the gate insulating film 3 therebetween.

In a region free from the semiconductor layer 2, wiring layers 5 such as a gate wiring 5a and a source wiring 5b are formed on a part of the gate insulating film 3. Further, a flattening layer 19 for flattening irregularities formed by these wirings 5 is formed. The semiconductor layer 3 is formed in the portion shown by the dotted line in FIG. 2. The flattening layer 19 is not formed on the gate insulating film 3 in the region where the semiconductor layer 3 is formed. As a result, the flattening layer 19 is formed to have a shape surrounding the semiconductor layer 2 as the substrate 1 is viewed in plane. Specifically, as shown in FIG. 3, the semiconductor device produced by the production method of Embodiment 1 includes a flattening layer having a shape surrounding the semiconductor layer when the substrate is viewed in plane. This is because the photosensitive wavelength range of the photosensitive organic film, which constitutes the flattening layer 19, overlaps with the absorption wavelength range of the semiconductor layer 2, and as a result, the photosensitive organic film on the semiconductor layer 2 is removed without being cured.

As shown in FIG. 2, the gate electrode 6 is formed on a part of the semiconductor layer 2 and on a part of the gate insulating film 3. On the wiring layer 5 and the gate electrode 6, no flattening layer is formed. This is because light having a wavelength range corresponding to that of the photosensitive organic film can not pass through the wiring layer 5 and the gate electrode, and as a result, the photosensitive organic film on the semiconductor layer 2 is removed without being cured. As a result, the entire base patterns formed on the substrate is flattened.

Although not shown in FIGS. 2 and 3, an interlayer insulating film is formed over the entire region of the gate insulating film 3, the gate electrode 6, the wiring layer 5, the flattening layer 19, and the like. This interlayer insulating film flatten the entire base patterns, which can improve various problems, such as short-circuits between two wirings arranged with the interlayer insulating film therebetween and between wirings arranged in layers upper than the interlayer insulating film. The interlayer insulating film has openings in a region overlapping with the semiconductor layer. In these openings, various electrodes of a semiconductor element, including a source electrode and a drain electrode, are formed.

According to Embodiment 1, the photosensitive organic film, which constitutes the flattening layer 19, is made of a material with a relative permittivity lower than that of a material for the interlayer insulating film, and therefore, generation of a capacitance between adjacent wiring layers 5, can be reduced. As a result, a semiconductor device in which delay of a signal transmitted to the wiring layer 5 can be more suppressed can be provided.

The present application claims priority to Patent Application No. 2007-200632 filed in Japan on Aug. 1, 2007 under the Paris Convention and provisions of national law in a designated State, the entire contents of which are hereby incorporated by reference.

BRIEF DESCRIPTION OF DRAWINGS

FIG. 1-1 is one of the views showing a procedure of producing a semiconductor device in accordance with a production method of Embodiment 1 and showing a cross-section of the device where the semiconductor layer 2 has been formed into an island shape.

FIG. 1-2 is one of the views showing a procedure of producing a semiconductor device in accordance with a production method of Embodiment 1 and showing a cross-section of the device where the gate insulating film 3 has been formed.

FIG. 1-3 is one of the views showing a procedure of producing a semiconductor device in accordance with a production method of Embodiment 1 and showing a cross-section of the device where the conductive film 4 has been formed.

FIG. 1-4 is one of the views showing a procedure of producing a semiconductor device in accordance with a production method of Embodiment 1 and showing a cross-section of the device where the wiring layer 5 and the gate electrode 6 have been formed.

FIG. 1-5 is one of the views showing a procedure of producing a semiconductor device in accordance with a production method of Embodiment 1 and showing a cross-section of the device where the ion 8 has been implanted.

FIG. 1-6 is one of the views showing a procedure of producing a semiconductor device in accordance with a production method of Embodiment 1 and showing a cross-section of the device where the photosensitive organic film 9 has been formed.

FIG. 1-7 is one of the views showing a procedure of producing a semiconductor device in accordance with a production method of Embodiment 1 and showing a cross-section of the device where the exposure has been performed.

FIG. 1-8 is one of the views showing a procedure of producing a semiconductor device in accordance with a production method of Embodiment 1 and showing a cross-section of the device where the flattening layer 19 has been formed.

FIG. 1-9 is one of the views showing a procedure of producing a semiconductor device in accordance with a production method of Embodiment 1 and showing a cross-section of the device where the interlayer insulating film 11 has been provided with the contact holes 12.

FIG. 1-10 is one of the views showing a procedure of producing a semiconductor device in accordance with a production method of Embodiment 1 and showing a cross-section of the device where the source wiring 13b and the drain wiring 13c have been formed.

FIG. 5-1 is one of the views showing a procedure of producing a semiconductor device in accordance with one example related to the present invention and showing a cross-section of the device where the gate insulating film 103 has been formed.

FIG. 5-2 is one of the views showing a procedure of producing a semiconductor device in accordance with one example related to the present invention and showing a cross-section of the device where the wiring layer 105 and the gate electrode 106 have been formed.

FIG. 5-3 is one of the views showing a procedure of producing a semiconductor device in accordance with one example related to the present invention and showing a cross-section of the device where the photosensitive organic film 109 has been formed.

FIG. 5-4 is one of the views showing a procedure of producing a semiconductor device in accordance with one example related to the present invention and showing a cross-section of the device where the exposure has been performed.

FIG. 5-5 is one of the views showing a procedure of producing a semiconductor device in accordance with one example related to the present invention and showing a cross-section of the device where the flattening layer 119 has been formed.

FIG. 5-6 is one of the views showing a procedure of producing a semiconductor device in accordance with one example related to the present invention and showing a cross-section of the device where the source wiring 113b and the drain wiring 113c have been formed.

EXPLANATION OF NUMERALS AND SYMBOLS 1, 101, 201: Transparent substrate
2, 102, 202: Semiconductor layer
2a: Channel region
2b: Source region
2c: Drain region
3, 103, 203: Gate insulating film
4: Conductive film
5, 105, 205: Wiring layer
5a, 105a, 205a: Gate wiring
5b, 105b, 205b: Source wiring
6, 106, 206: Gate electrode
7: Resist Pattern 8: Ion
9, 109: Photosensitive organic film
10: Light
11, 111, 211: Interlayer insulating film
12: Contact hole
13b, 113b: Source wiring
13c, 113c: Drain wiring
19, 119: Flattening layer
200: Metal residue

The invention claimed is:

1. A production method of a semiconductor device including a semiconductor layer, a wiring layer and a flattening layer on a substrate,
   the flattening layer surrounding the semiconductor layer and extending around at least a portion of the wiring layer when the substrate is viewed in plane, the wiring layer being spatially separated from the semiconductor layer when the substrate is viewed in plane,
   the production method comprising the steps of:
   forming the semiconductor layer on the substrate;
   forming a photosensitive organic film on the semiconductor layer and on the wiring layer,
   the photosensitive organic film having a photosensitive wavelength range overlapping with an absorption wavelength range of the semiconductor layer, and
   forming the flattening layer by exposing the photosensitive organic film from a side of the substrate to light having a wavelength range corresponding to the photosensitive wavelength range of the photosensitive organic film, thereby developing the photosensitive organic film.

2. The production method of the semiconductor device according to claim 1,
   further comprising the steps of:
   forming an interlayer insulating film on the semiconductor layer; and
   providing the interlayer insulating film in a region overlapping with the semiconductor layer with an opening.

3. A production method of a semiconductor device including a semiconductor layer and a flattening layer on a substrate,
   the flattening layer surrounding the semiconductor layer when the substrate is viewed in plane,
   the production method comprising the steps of:
   forming the semiconductor layer on the substrate;
   forming a photosensitive organic film on the semiconductor layer,
   the photosensitive organic film having a photosensitive wavelength range overlapping with an absorption wavelength range of the semiconductor layer, and
   forming a flattening layer by exposing the photosensitive organic film from a side of the substrate to light having a wavelength range corresponding to the photosensitive wavelength range of the photosensitive organic film, thereby developing the photosensitive organic film,
   further comprising a step of forming an interlayer insulating film on the flattening layer,
   wherein the photosensitive organic film is made of a material with a relative permittivity lower than that of a material for the interlayer insulating film.

4. A semiconductor device comprising a semiconductor layer and a wiring layer on a substrate,
   wherein the semiconductor device includes a flattening layer surrounding the semiconductor layer and extending around at least a portion of the wiring layer when the substrate is viewed in plane, the wiring layer being spatially separated from the semiconductor layer when the substrate is viewed in plane, and
   the flattening layer is formed from a photosensitive organic film having a photosensitive wavelength range overlapping with an absorption wavelength range of the semiconductor layer.

5. The semiconductor device according to claim 4,
   wherein the semiconductor device includes an interlayer insulating film on the semiconductor layer, and
   the interlayer insulating film in a region overlapping with the semiconductor layer has an opening.

6. A semiconductor device comprising a semiconductor layer on a substrate,
   wherein the semiconductor device includes a flattening layer surrounding the semiconductor layer when the substrate is viewed in plane, and
   the flattening layer is formed from a photosensitive organic film having a photosensitive wavelength range overlapping with an absorption wavelength range of the semiconductor layer,
   wherein the semiconductor device includes an interlayer insulating film on the flattening film, and
   the photosensitive organic film is made of a material with a relative permittivity lower than that of a material for the interlayer insulating film.

7. An exposure apparatus used for producing a semiconductor device,
   the semiconductor device including a semiconductor layer, a wiring layer and a flattening layer on a substrate,
   the flattening layer being formed by patterning a photosensitive organic film into a shape surrounding the semiconductor layer and extending around at least a portion of the wiring layer when the substrate is viewed in plane, the wiring layer being spatially separated from the semiconductor layer when the substrate is viewed in plane,
   wherein the exposure apparatus includes a light source that radiates light having a wavelength range overlapping with an absorption wavelength range of the semiconductor layer and with a photosensitive wavelength range of the flattening layer to the photosensitive organic film from a side of the substrate.

* * * * *